United States Patent [19]

Matsunaga

[11] Patent Number: 4,539,580
[45] Date of Patent: Sep. 3, 1985

[54] HIGH DENSITY INTEGRATED CIRCUIT DEVICE WITH MOS TRANSISTOR AND SEMICONDUCTOR REGION HAVING POTENTIAL WELLS

[75] Inventor: Junichi Matsunaga, Yokohama, Japan

[73] Assignee: Tokyo Shibaura Denki Kabushiki Kaisha, Kawasaki, Japan

[21] Appl. No.: 419,068

[22] Filed: Sep. 16, 1982

[30] Foreign Application Priority Data

Oct. 9, 1981 [JP] Japan .................................. 56-161348

[51] Int. Cl.$^3$ ...................... H01L 29/94; H01L 21/98
[52] U.S. Cl. ........................................ 357/23; 357/68; 365/174; 365/51
[58] Field of Search .............. 357/23 C, 68; 365/51, 365/72, 182, 174, 103, 104

[56] References Cited

U.S. PATENT DOCUMENTS 4,163,245  7/1979  Kinoshita .......................... 357/23 C

OTHER PUBLICATIONS

Jun-ichi Matsunaga et al., "Design Limitations Due to Substrate Currents and Secondary Impact Ionization Electrons in NMOS LSI's Proceedings of 11th Conference (1979 International) on Solid State Devices, Tokyo, 1979 Japanese Journal of Applied Physics, vol. 19, (1980), Supplement 19-1, pp. 93-97.

Primary Examiner—Andrew J. James
Assistant Examiner—Sheila V. Clark
Attorney, Agent, or Firm—Finnegan, Henderson, Farabow, Garrett & Dunner

[57] ABSTRACT

A semiconductor device includes a dynamic memory area formed in a semiconductor substrate and set in an inequilibrium potential state, and a plurality of MOS transistors which emit minority carriers or more than a predetermined number into said semiconductor substrate during operation in a saturation region. Each of the MOS transistors is so arranged that a prolonged line extending in a direction from the source region to the drain region may cross the dynamic memory area.

7 Claims, 3 Drawing Figures

HIGH DENSITY INTEGRATED CIRCUIT DEVICE WITH MOS TRANSISTOR AND SEMICONDUCTOR REGION HAVING POTENTIAL WELLS

BACKGROUND OF THE INVENTION

The present invention relates to a semiconductor device which includes a semiconductor region having a potential locally susceptible to change by minority carriers and a MOS transistor arranged around the semiconductor region.

A MOS transistor which operates in a saturation region is known to emit minority carriers into a semiconductor substrate from a depletion layer near the drain [Proceedings of the 11th Conference on Solid State Devices; Japanese Journal of Applied Physics. Vol. 19 (1980), Suppl. 19-1, pp 93 to 97].

The mode of operation of such a MOS transistor will now be described with reference to an n-channel MOS transistor shown in FIG. 1. When the MOS transistor shown in FIG. 1 operates in a saturation region, a channel current $I1$ flows from a source region 2 to a drain region 4 through a channel path 6 which is pinched off at the intermediate portion thereof and a depletion layer 8 formed in the surface area of a p-type substrate 10. The channel current $I1$ then flows to ground through the drain region 4 and a battery E1. In this case, a high electric field is established at that part of the depletion layer 8 which lies between the pinched off portion of the channel path 6 and the drain region 4. When the channel current $I1$ flows through the part having this high electric field, impact ionization is caused within the depletion layer 8 to generate hole-electron pairs. The holes generated in this manner flow to ground through the substrate 10 as a substrate current $I2$. Some of the electrons emitted by the impact ionization within the depletion layer 8 are attracted to the drain region 4 under the influence of the high electric field, while the remaining electrons diffuse into the substrate 10. The electrons injected into the substrate 10 in this manner continue to spread until they recombine with holes in the p-type substrate 10. Such electrons as to move in the substrate 10 tend to be more readily emitted from an output MOS transistor with a wide channel path or from a MOS transistor to which a drain voltage, raised by a bootstrap circuit or the like, is applied.

In a semiconductor element such as a semiconductor memory, especially a dynamic memory or a CCD image pick-up element an MOS transistor emitting minority carriers or electrons into that semiconductor substrate during operation in the saturation region is sometimes arranged near a semiconductor region within the semiconductor substrate which is set in a potential state which is not equilibrium. As used herein, such a semiconductor region is defined as a semiconductor region having a potential which is locally susceptible to change by minority carriers. Minority carriers or electrons which diffuse into the semiconductor substrate from the MOS transistor may flow into a potential well formed within the semiconductor region. This causes a change in the memory state or analog charge amount which can result in an erroneous operation of the semiconductor element.

When the minority carriers from the MOS transistor diffuse into the potential well of the semiconductor region set in the inequilibrium potential state, the potential well which has been empty is filled with the electrons and the stored data is thus inadvertently changed. This is described, for example, in "IEEE Trans. Electron Devices. ED-26 (1979) 1684". This erroneous operation is most likely to be caused in a memory cell which is close to the MOS transistor. In a case, for example, where the size of the memory cell is $10 \times 10$ $\mu m^2$, the thickness of the gate oxide film of the memory cell is 400 Å, the refresh cycle for the memory cell is 5 m sec. and the operation voltage is 5 V, the operation of the memory cell may be affected if a minority carrier current of more than $1 \times 10^{-10}$ A flows into the memory cell area.

In the prior art, in order to solve this problem, a MOS transistor which causes a carrier current flow which may adversely affect the operation of the memory cell or which emits minority carriers of more than, for example, $1 \times 10^{-10}$ A, is arranged at a distance from the memory cell. The distance is, for example, selected to be 50 $\mu m$ which is the diffusion length of electrons or longer. When these measures are taken, the minority carriers such as the electrons emitted from the MOS transistor recombine with the holes within the substrate before they reach the memory cell, so that the adverse effects of the carrier current of the MOS transistor may be eliminated. However, this requirement of arranging a MOS transistor at a distance from the memory cell results in a low packing density.

SUMMARY OF THE INVENTION

It is an object of the present invention to provide a semiconductor device in which a MOS transistor or transistors which emit minority carriers into a substrate may be arranged relatively close to a semiconductor region set in an inequilibrium potential state.

According to an aspect of the present invention, there is provided a semiconductor device comprising a semiconductor region set in an inequilibrium potential state, and at least one MOS transistor which emits minority carriers of more than a predetermined number during operation in a saturation region, the MOS transistor being arranged with a line extending in a direction from a source region thereof toward a drain region thereof crossing said semiconductor region.

DETAILED DESCRIPTION OF THE PREFERRED EMBODIMENT

Figure 1:
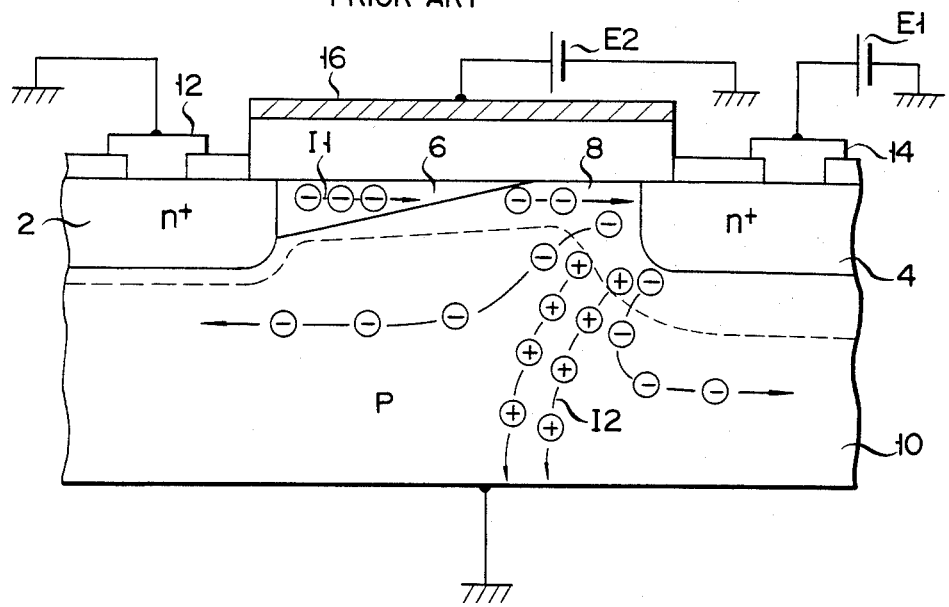
FIG. 1 is a model view illustrating a MOS transistor which emits minority carriers into a substrate during operation in the saturation region.
Figure 2:
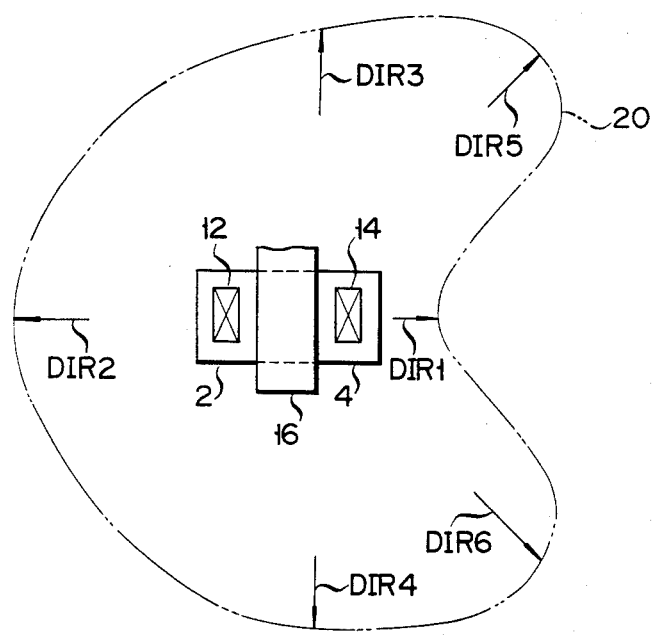
FIG. 2 is a view showing the equicurrent density distribution of a current caused by the minority carriers which diffuse into the substrate from the MOS transistor shown in FIG. 1.

The present inventors have studied the distribution of the minority carriers which diffuse into a semiconductor substrate from a MOS transistor when the MOS transistor operates in the saturation region. In an experiment conducted, a source electrode 12 was grounded, and voltages of 5 V from batteries E1 and E2 were applied to a drain electrode 14 and a gate electrode 16, respectively, as shown in FIG. 1. FIG. 2 shows an equicurrent density distribution 20 of the current caused by the flow of the minority carriers or electrons which are generated in a depletion layer 8 formed in the vicinity of a drain region 4 opposing a source region 2 of the n-channel MOS transistor operating in the saturation region, and which diffuse into a substrate 10. As may be clearly seen from this distribution 20, the electrons which are generated in the depletion layer 8 and which diffuse into the substrate 10 do not flow much in a direction DIR1 or in a direction from the source region 2 to the drain region 4. On the other hand, many electrons flow in a direction DIR2 or in a direction from the drain region 4 to the source region 2, and in directions DIR3 and DIR4 which are perpendicular to the line connecting the source and drain regions 2 and 4. The largest number of electrons flow in directions DIR5 and DIR6 which are at an angle of $\pm 45°$ with respect to the line connecting the source and drain regions 2 and 4. In other words, the electrons which diffuse into the substrate flow within the substrate; the smallest number of electrons flow in the direction DIR1 or in the minimum minority carrier flow direction, and the largest number of electrons flow in the directions DIR5 and DIR6 or in the maximum minority carrier flow directions.

Based on the analysis as described above, the present inventors have reached the following conclusion. If a MOS transistor which emits a relatively large number of minority carriers into the substrate during operation in the saturation region, is arranged to hold a specific positional relationship with a semiconductor region of a dynamic memory or the like which is set in an inequilibrium potential state, it can be arranged near the semiconductor region so that the minority carriers emitted by it may not adversely affect the operation of the semiconductor region.

Figure 3:
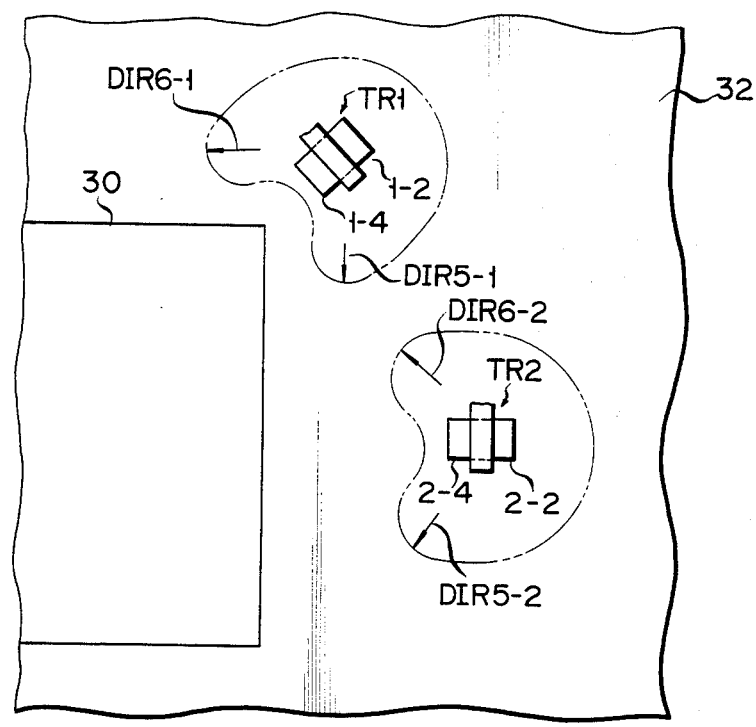
FIG. 3 is a view illustrating the arrangement of a dynamic memory area and MOS transistors according to one embodiment of the present invention.

FIG. 3 shows the positional relationship of a dynamic memory area 30 formed in a substrate 32 and MOS transistors TR1 and TR2 formed within the same substrate 32 according to an embodiment of the present invention. During operation in the saturation region, these MOS transistors TR1 and TR2 emit minority carriers of more than a predetermined number to cause a current flow of minority carrier exceeding about $1 \times 10^{-10}$ A, which could cause erroneous operation of the dynamic memory area 30. Examples of such MOS transistors TR1 and TR2 are output MOS transistors having wide channels or MOS transistors in which a voltage raised by a bootstrap circuit (not shown) or the like is applied to the drains thereof.

As may be seen from FIG. 3, the dynamic memory area 30 is of a rectangular shape. The transistor TR1 is so arranged that a line extending in a direction from a source region 1-2 to a drain region 1-4 bisects the angle at one corner of the dynamic memory area 30. The transistor TR2 is so arranged that a line extending in a direction from a source region 2-2 to a drain region 2-4 is normal to one side of the dynamic memory area 30. With this arrangement, the maximum minority carrier flow directions DIR5-1 and DIR6-1 of the MOS transistor TR1 are parallel to the sides of the dynamic memory area 30 which are perpendicular to each other. For this reason, even if the MOS transistor TR1 is placed relatively close to the dynamic memory area 30, minority carriers 9 emitted from the MOS transistor TR1 may not flow into the dynamic memory area 30 and will not adversely affect the operation thereof. Furthermore, since the maximum minority carrier flow directions DIR5-2 and DIR6-2 of the MOS transistor TR2 are set at angles of about 45° with respect to one side of the dynamic memory area 30, the minority carriers emitted from the MOS transistor TR2 and flowing in the directions DIR5-2 and DIR6-2 flow for a relatively long distance. During the course of flow, these minority carriers may recombine with the other type of minority carriers in the substrate. Accordingly, the MOS transistor TR2 can also be arranged close to the dynamic memory area 30 or at a distance of, for example, $25\sqrt{2}$ to 50 $\mu$m from the dynamic memory area 30. It is also possible to arrange the MOS transistor TR2 close to the dynamic memory area 30 so that the dynamic memory area 30 is completely within a region bounded by the maximum minority carrier flow directions DIR5-2 and DIR6-2.

Although the present invention has been described with reference to a particular embodiment thereof, the present invention is not limited to this embodiment. For example, although the dynamic memory area 30 is used in the embodiment shown in FIG. 3, any other semiconductor element may be alternatively used such as a CCD image pick-up element which includes a semiconductor substrate region set in an inequilibrium. Although the dynamic memory area 30 is of a rectangular shape in the embodiment described above, it may be of any other shape such as a circle or square. Although only two MOS transistors TR1 and TR2 are shown in FIG. 3, more MOS transistors may be arranged around the dynamic memory area 30.

What is claimed is:

1. A semiconductor device comprising:
    a semiconductor substrate;
    a semiconductor region formed within said semiconductor substrate and having a potential locally susceptible to change by minority carriers; and
    at least one MOS transistor having source and drain regions and which emits minority carriers of more than a predetermined number into said semiconductor substrate during operation in a saturation region, wherein said semiconductor region is arranged in an area defined by two boundary lines which start from said MOS transistor and form angles of substantially $\pm 45°$ with respect to a line connecting said source and drain regions, and wherein the material connecting said semiconductor region and said MOS transistor is semiconductor material of uniform conductivity type.

2. A semiconductor device according to claim 1, wherein said semiconductor region is of substantially rectangular shape, and said at least one MOS transistor is arranged with said two boundary lines being substantially parallel to two sides of said semiconductor region.

3. A semiconductor device according to claim 2, wherein said at least one MOS transistor is arranged at a distance of not more than 50 $\mu$m from said said semiconductor region.

4. A semiconductor device according to claim 1, wherein said at least one MOS transistor is arranged at a distance of not more than 50 $\mu$m from said semiconductor region.

5. A semiconductor device comprising:
    a semiconductor substrate;
    a semiconductor region formed within said substrate and having a potential locally susceptible to change by minority carriers; and
    at least one MOS transistor having source and drain regions and which emits minority carriers of more than a predetermined number into said semiconductor substrate during operation in a saturation region, wherein said semiconductor region is of substantially rectangular shape and is arranged in an area defined by two boundary lines which start from said MOS transistor and form angles of substantially ±45° with respect to a line connecting said source and drain regions, said at least one MOS transistor being arranged with said two boundary lines being substantially parallel to two sides of said semiconductor region.

6. A semiconductor device according to claim 5, wherein said at least one MOS transistor is arranged at a distance of not more than 50 $\mu$m from said semiconductor region.

7. A semiconductor device according to claim 5 or 6, wherein said at least one MOS transistor is arranged at a distance of not more than 50 $\mu$m from said semiconductor region.

* * * * *